US011540425B2

(12) United States Patent
Ashwood et al.

(10) Patent No.: US 11,540,425 B2
(45) Date of Patent: Dec. 27, 2022

(54) ACOUSTIC AIR PUMP

(71) Applicants: Andrea Ashwood, Culver City, CA (US); Dillon Johnson, Marina Del Rey, CA (US); Daniel C. Wiggins, Port Hueneme, CA (US)

(72) Inventors: Andrea Ashwood, Culver City, CA (US); Dillon Johnson, Marina Del Rey, CA (US); Daniel C. Wiggins, Port Hueneme, CA (US)

(73) Assignee: Snap Inc., Santa Monica, CA (US)

( * ) Notice: Subject to any disclaimer, the term of this patent is extended or adjusted under 35 U.S.C. 154(b) by 222 days.

(21) Appl. No.: 16/888,050

(22) Filed: May 29, 2020

(65) Prior Publication Data

US 2021/0378152 A1 Dec. 2, 2021

(51) Int. Cl.

*H05K 7/20* (2006.01)
*G02B 27/01* (2006.01)
*H04R 1/02* (2006.01)

(52) U.S. Cl.

CPC ..... *H05K 7/20909* (2013.01); *G02B 27/0176* (2013.01); *H04R 1/025* (2013.01); *H04R 1/028* (2013.01); *G02B 2027/0178* (2013.01)

(58) Field of Classification Search

CPC .... H05K 7/20909; H04R 1/025; H04R 1/028; H04R 1/2823; H04R 1/2846; G02B 27/0176; G02B 2027/0178

See application file for complete search history.

(56) References Cited

U.S. PATENT DOCUMENTS

| | | | | |
|---|---|---|---|---|
| 4,757,547 A * | 7/1988 | Danley | H04R 9/022 381/124 |
| 5,042,072 A * | 8/1991 | Button | H04R 9/022 381/397 |
| 5,357,586 A * | 10/1994 | Nordschow | H04R 9/022 381/397 |
| 10,609,465 B1 * | 3/2020 | Wakeland | H04R 1/347 |
| 2021/0051816 A1 * | 2/2021 | Huang | H04R 9/022 |
| 2021/0352410 A1 * | 11/2021 | O'Brien | H04R 9/022 |

* cited by examiner

*Primary Examiner* — Jason R Kurr

(74) *Attorney, Agent, or Firm* — Culhane Meadows PLLC; Stephen J. Weed

(57) ABSTRACT

A cooling device generating unidirectional air flow to cool an electrical component. The cooling device is an equivalent of an electrical acoustic diode to make air flow only one direction. A speaker generates air flow in a first passageway to a cavity, and then expels air out from the cavity through a second passageway. An electrical component is cooled by the air flow, and may be positioned adjacent the passageways, or positioned in the cavity. In one example, eyewear having an electrical component positioned in a temple is cooled by the cooling device.

20 Claims, 12 Drawing Sheets

10 14 48 22 34 42 26 40 32 28 24 30 46 34

| Passageway | Pressure |
|---|---|
| Left Straight | 0.07825 Pa / 71.85 dB SPL |
| Right Straight | 0.07733 Pa / 71.75 dB SPL |
| Left Tapered | 0.1553 Pa / 77.80 dB SPL |
| Right Tapered | 0.1881 Pa / 79.47 dB SPL |

| Opening | Signal | Pressure |
| --- | --- | --- |
| Small | 307 uV | 0.0307 Pa |
| Large | 452 uV | 0.0452 Pa |

FIG. 10

ACOUSTIC AIR PUMP

TECHNICAL FIELD

The present subject matter relates to generating air flow to cool an electronic device.

BACKGROUND

Portable eyewear devices, such as smart glasses, headwear, and headgear available today include electrical devices that generate heat.

BRIEF DESCRIPTION OF THE DRAWINGS

The drawing figures depict one or more implementations, by way of example only, not by way of limitations. In the figures, like reference numerals refer to the same or similar elements.

FIG. 10 illustrates the calculated pressure at each opening;

DETAILED DESCRIPTION

Figure 1:
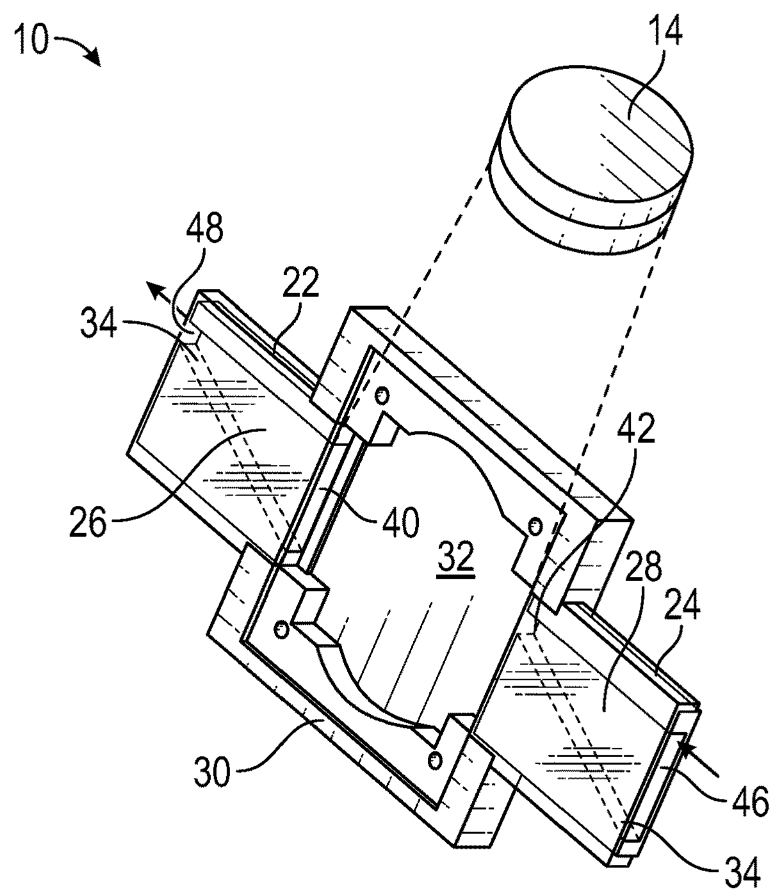
FIG. 1 is an exploded view of a cooling device according to a first example.

This disclosure includes a cooling device generating unidirectional air flow to cool an electrical component. The cooling device is an equivalent of an electrical acoustic diode to make air flow only one direction. A speaker generates air flow in a first passageway to a cavity, and then expels air out from the cavity through a second passageway. An electrical component is cooled by the air flow, and may be positioned adjacent the passageways, or positioned in the cavity. In one example, eyewear having an electrical component positioned in a temple is cooled by the cooling device.

Additional objects, advantages and novel features of the examples will be set forth in part in the description which follows, and in part will become apparent to those skilled in the art upon examination of the following and the accompanying drawings or may be learned by production or operation of the examples. The objects and advantages of the present subject matter may be realized and attained by means of the methodologies, instrumentalities and combinations particularly pointed out in the appended claims.

In the following detailed description, numerous specific details are set forth by way of examples in order to provide a thorough understanding of the relevant teachings. However, it should be apparent to those skilled in the art that the present teachings may be practiced without such details. In other instances, well known methods, procedures, components, and circuitry have been described at a relatively high-level, without detail, in order to avoid unnecessarily obscuring aspects of the present teachings.

The term "coupled" as used herein refers to any logical, optical, physical or electrical connection, link or the like by which signals or light produced or supplied by one system element are imparted to another coupled element. Unless described otherwise, coupled elements or devices are not necessarily directly connected to one another and may be separated by intermediate components, elements or communication media that may modify, manipulate or carry the light or signals.

The orientations of the eyewear device, associated components and any complete devices incorporating an eye scanner and camera such as shown in any of the drawings, are given by way of example only, for illustration and discussion purposes. In operation for a particular variable optical processing application, the eyewear device may be oriented in any other direction suitable to the particular application of the eyewear device, for example up, down, sideways, or any other orientation. Also, to the extent used herein, any directional term, such as front, rear, inwards, outwards, towards, left, right, lateral, longitudinal, up, down, upper, lower, top, bottom and side, are used by way of example only, and are not limiting as to direction or orientation of any optic or component of an optic constructed as otherwise described herein.

Reference now is made in detail to the examples illustrated in the accompanying drawings and discussed below.

Referring to FIG. 1, there is shown a cooling system 10 having a speaker 14 and channel sections 22 and 24, each channel section extending away from each other and from a central body 30 having a cavity 32. The speaker 14 is coupled to a top portion of the central body 30 and faces cavity 32 to seal the cavity 32 with the channel sections 22 and 24. Due to the configuration of channel sections 22 and 24, the speaker 14 causes air to be pulled into cavity 32 through the channel section 24, such that the air exits through the opposing channel section 22. The two channel sections 22 and 24 have a passageway 26 and 28, respectively, each laterally extending from cavity 32 in opposite directions in a common plane. The passageways 26 and 28 have a cross-sectional area that is "ramped" from large to small, due to a divider 34 positioned in the respective passageway and angled from one end of the channel section to the other end. As shown, a larger opening 40 of passageway 26 in channel section 22 opens to cavity 32, and a smaller opening 42 of passageway 28 in channel section 24 opens to cavity 32. A larger opening 46 of passageway 28 in the channel section 24 and a smaller opening 48 of the passageway 26 in the channel section 22 open to the ambient.

Figure 2:
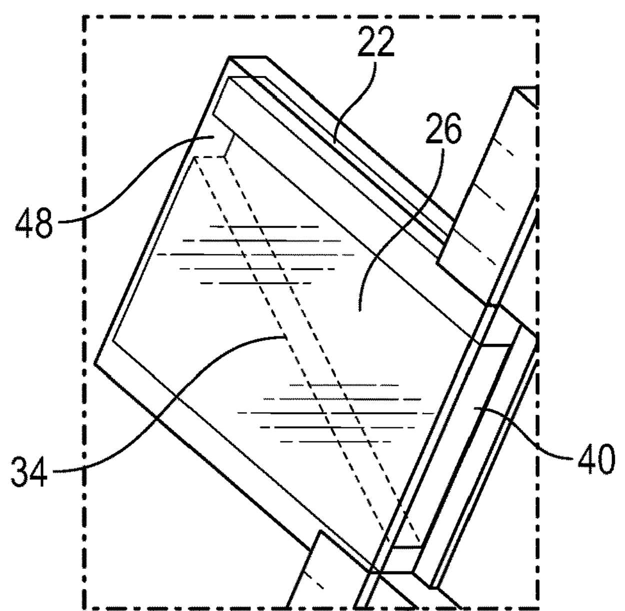
FIG. 2 is an enlarged view of one channel section illustrated a tapered passageway.

An enlarged view of the channel section 22 is shown in FIG. 2.

Each channel section 22 and 24 has a vertically extending divider 34 forming a mechanical "acoustic diode". When the speaker 14 is energized to pull up a speaker membrane thereby sucking air into cavity 32, it is easier (less resistance) for the speaker 14 to cause air to be drawn into cavity 32 through the larger opening 46 of the channel section 24 than through the smaller opening 48 of the channel section 22. When the speaker 14 is pressing down the speaker membrane toward the cavity 32 and thereby pushing air out of cavity 32, the majority of air in cavity 32 will tend to flow through the larger passageway opening 40 of channel section 22 than through the smaller passageway opening 42 of the channel section 24. This means that a net air flow will tend to flow one-way through the channel sections 22 and 24, entering from the larger passageway opening 46 of the channel section 24 to the larger passageway opening 48 of the channel section 22.

Figure 3:
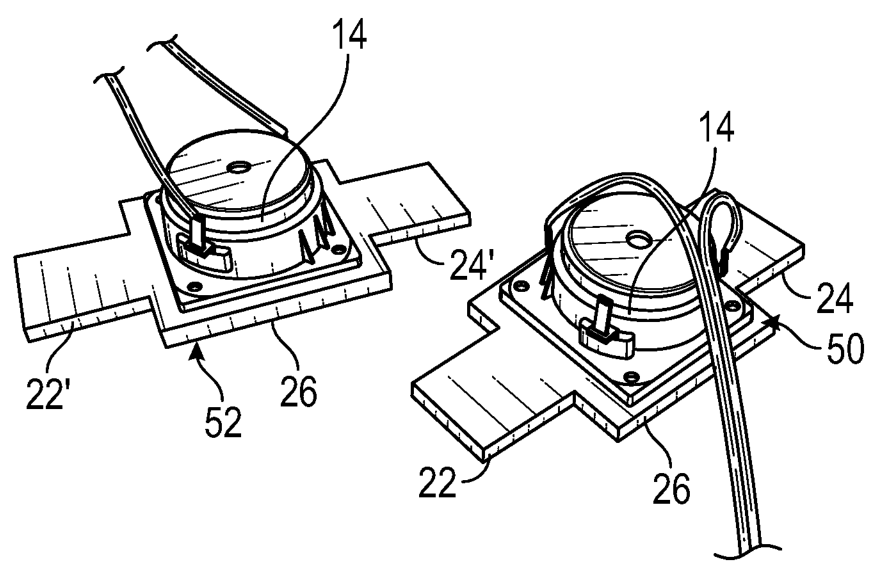
FIG. 3 is a perspective view of a test set-up for testing a unit with tapered passageways such as shown in FIG. 1, and a test unit with only straight passageways without a divider.

Referring to FIG. 3, there is shown a unit 50 having a speaker 14 and channel sections 22 and 24 each including a divider 34 forming tapered respective passageways 26 and 28 operating as mechanical acoustic diodes, and a unit 52 that is a "control" unit having a speaker 14 having channel sections 22' and 24' only having straight passageways with no dividers 34.

An AudioPrecision APx515 instrument, available from Audio Precision of Beaverton, Oreg., USA, is used with a calibrated test microphone (with 48V phantom power and preamp), and a small power amplifier to drive each of the respective speakers 14 of unit 50 and 52. A 60 Hz signal drives each speaker 14 to produce a 60 Hz tone—well below audibility for a human, but which generates a lot of air motion in the channel sections with little signal. The microphone measures the energy at the passageway openings of the straight passageways of channel sections 22' and 24', and at the openings 48 and 46 of the tapered passageways 22 and 24, respectively.

Figure 4:
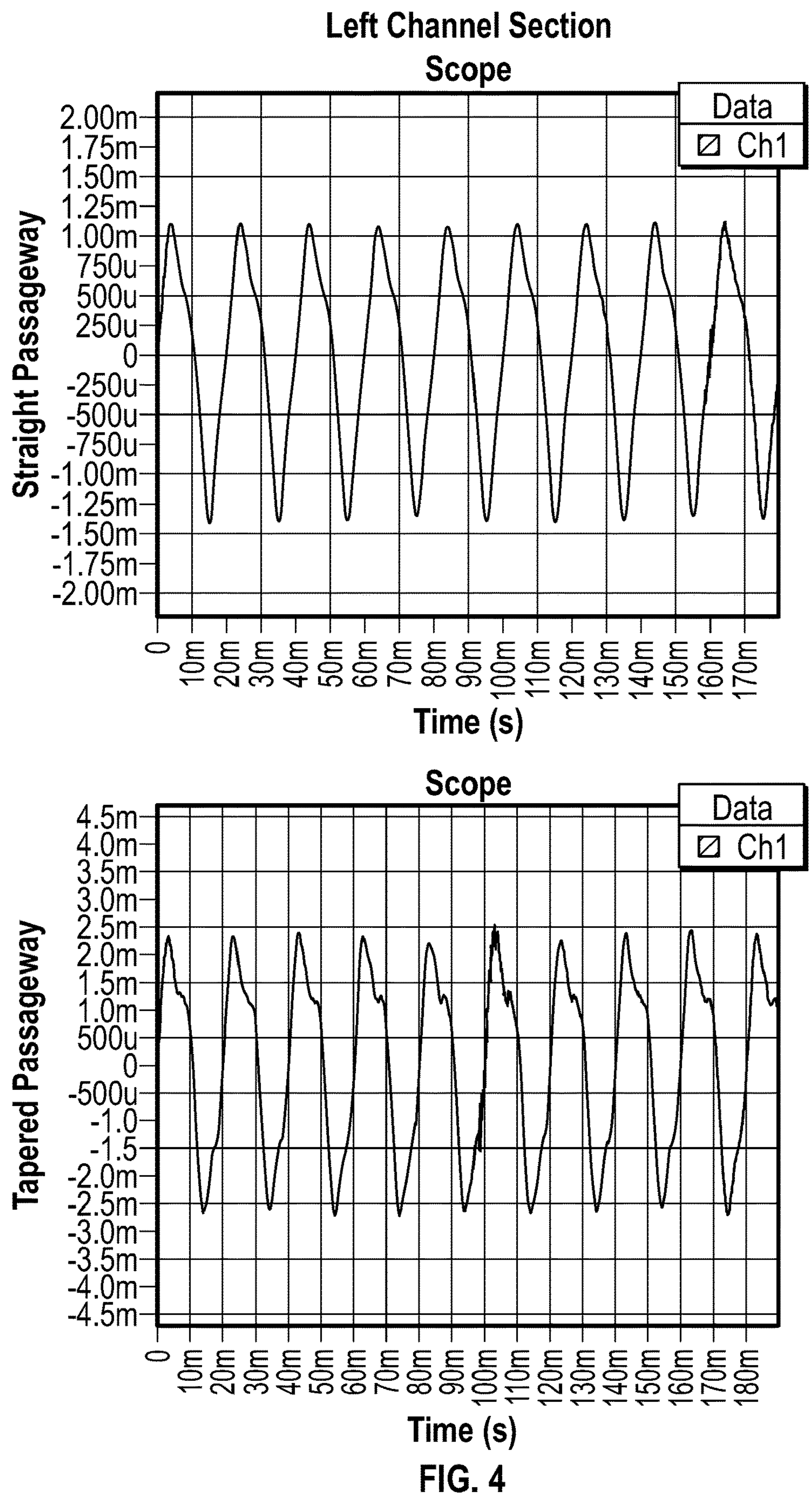
FIG. 4 is a waveform diagram illustrating the measured signal associated with the straight passageways of channel sections and the tapered passageways of the channel sections.
Figure 4:
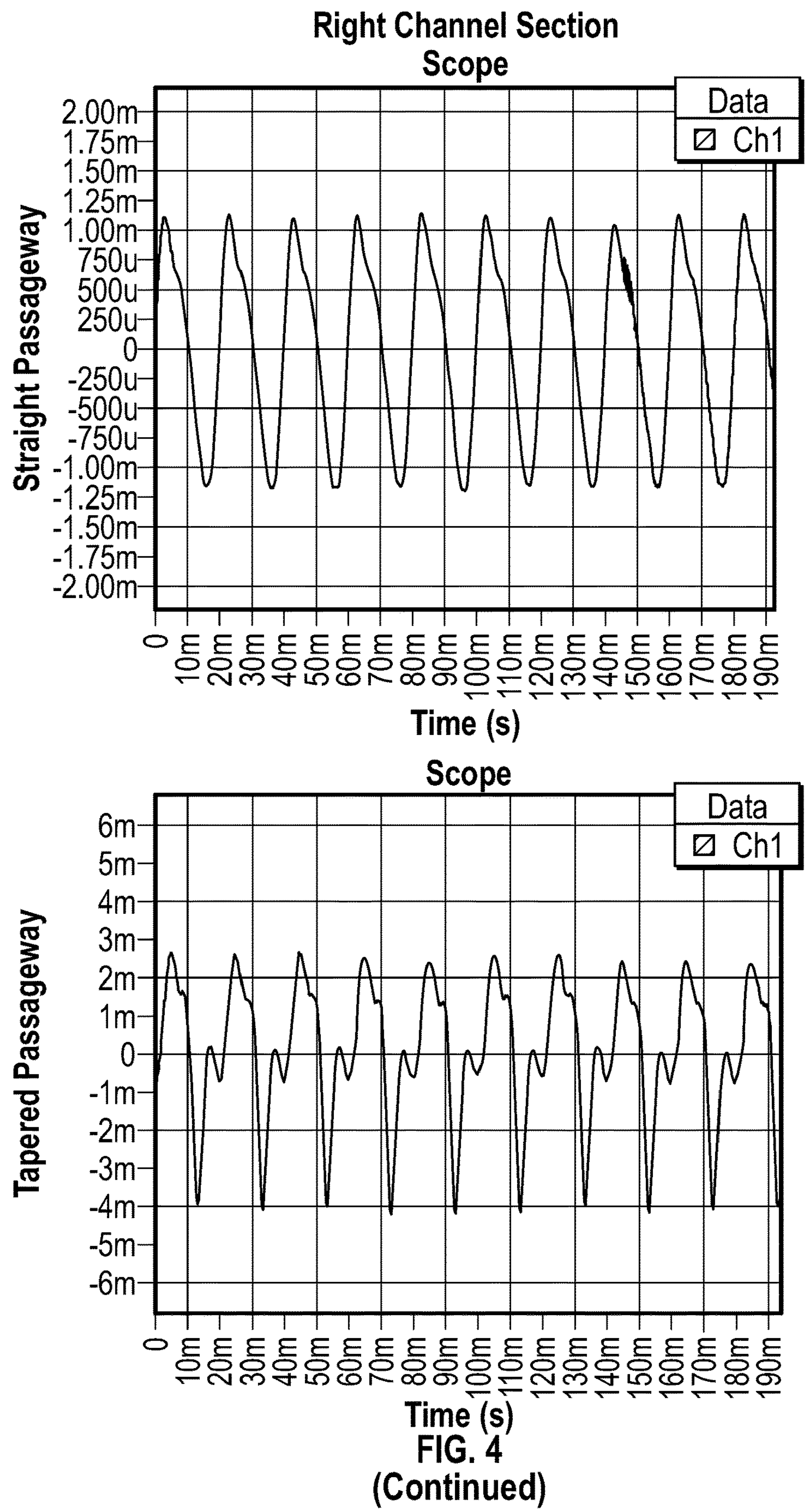

As shown in FIG. 4, a waveform of the measured signal associated with the straight passageways of channel sections 22' and 24' are quite similar is shape and centered about the 0 level. The waveform of the measured signal of the tapered passageways 26 and 28 are asymmetric and not centered about the 0 level, thus creating acoustic rectification. The left channel section refers to channel sections 22 and 22', and the right channel section refers to channel sections 24 and 24'.

Figure 5:
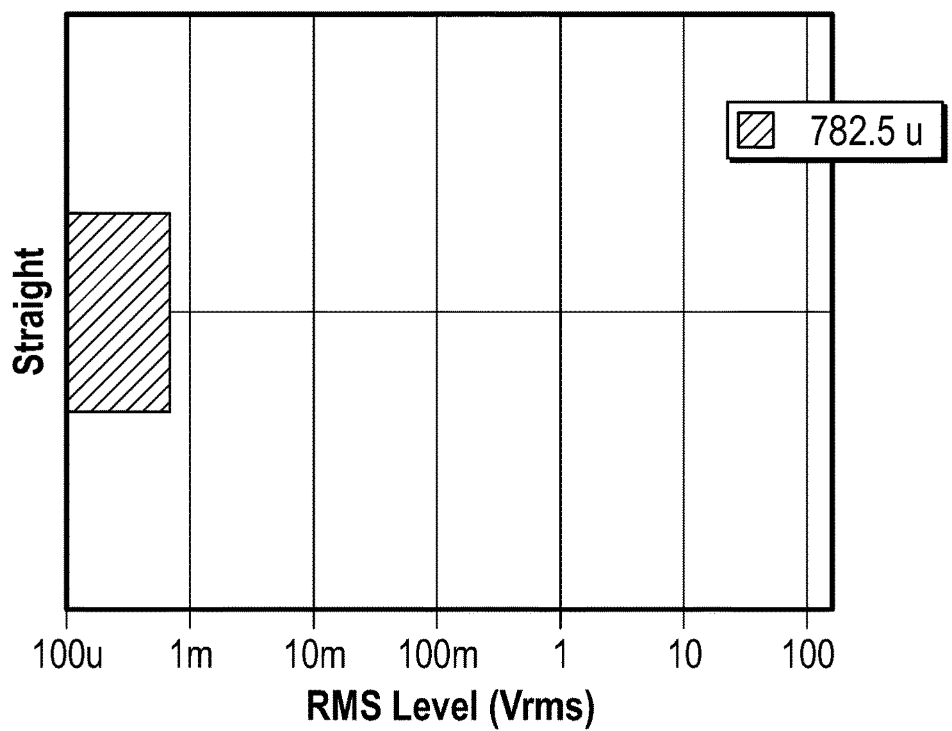
FIG. 5 shows root mean squared (RMS) values of the measured signals illustrated in FIG. 4.
Figure 5:
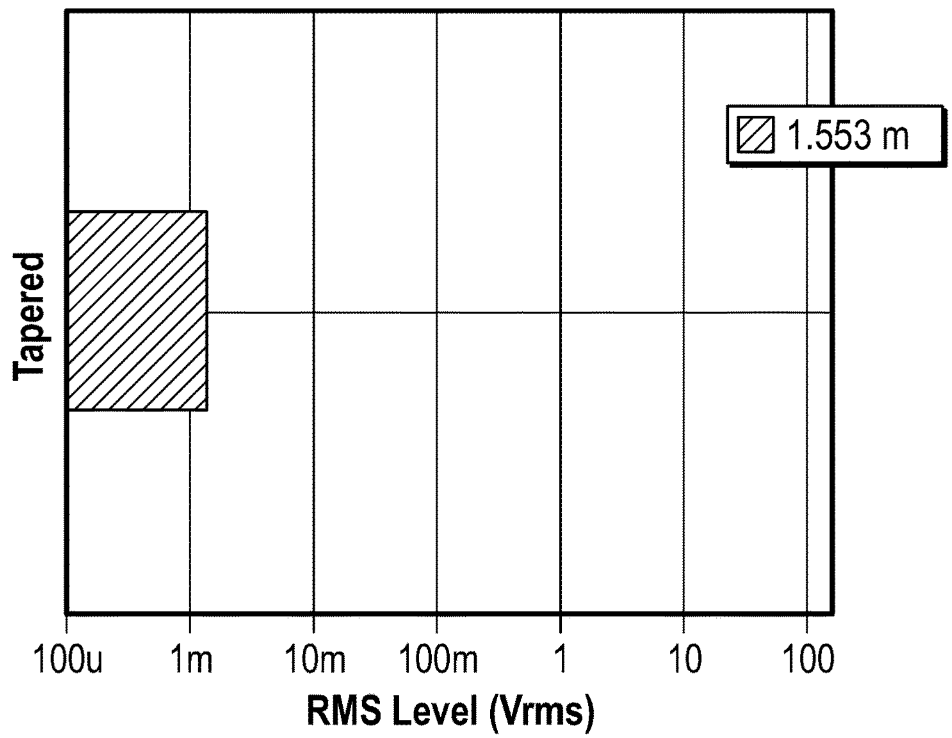
Figure 5:
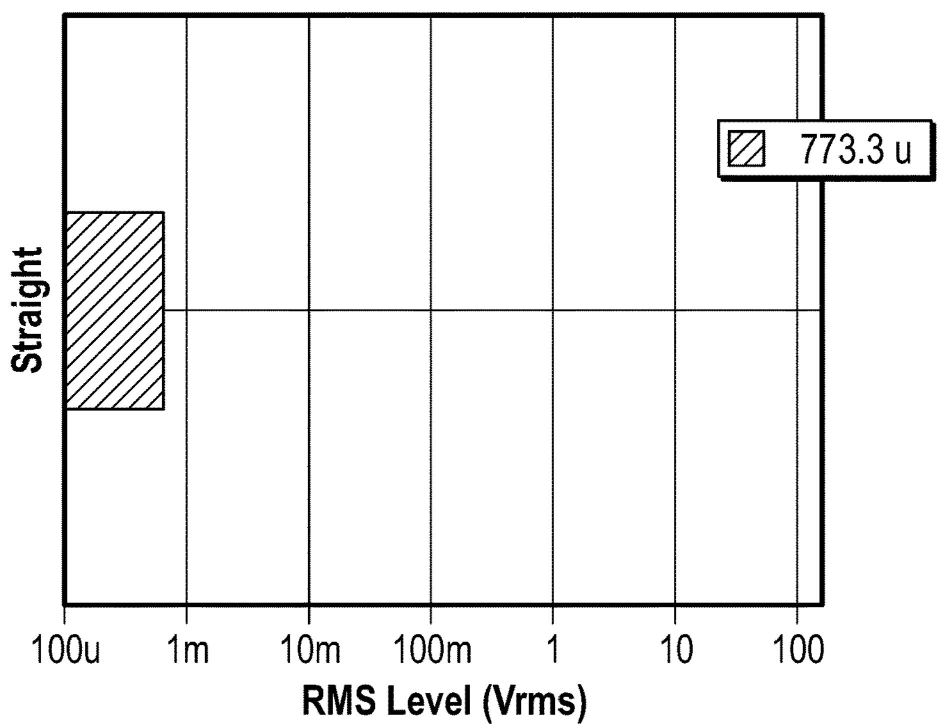
Figure 5:
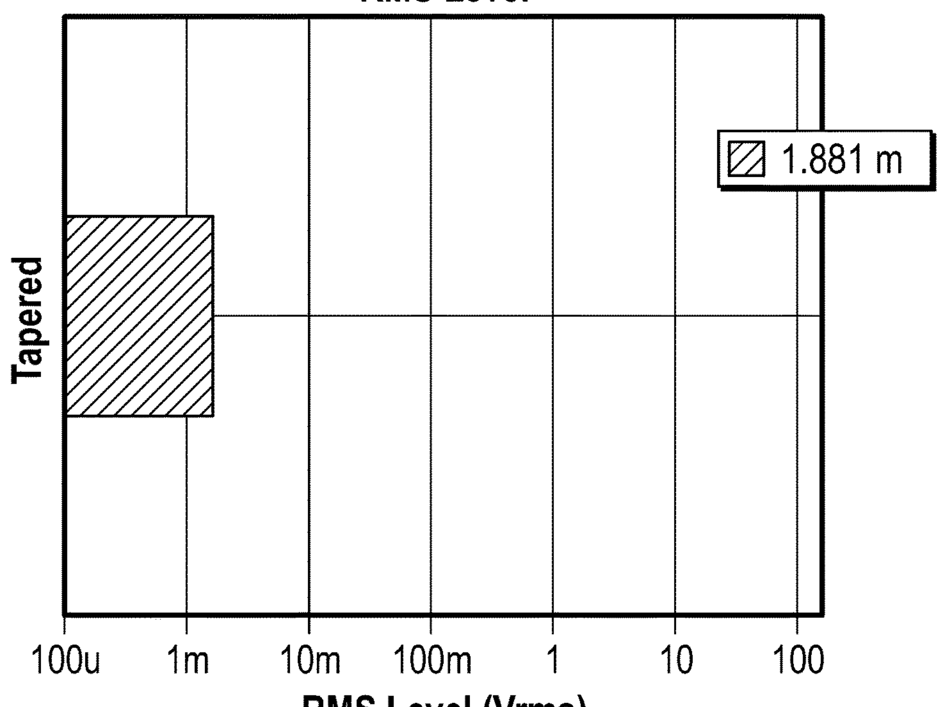

FIG. 5 shows root mean squared (RMS) values of the measured signals illustrated in FIG. 4. The shown RMS values of the measured output are the same for the straight passageways of channel sections 22' and 24', but the RMS values are different for the tapered passageways of channel sections 22 and 24. The RMS difference represents the net airflow into passageway 28 and exiting through passageway 26.

Figures 6, 7:
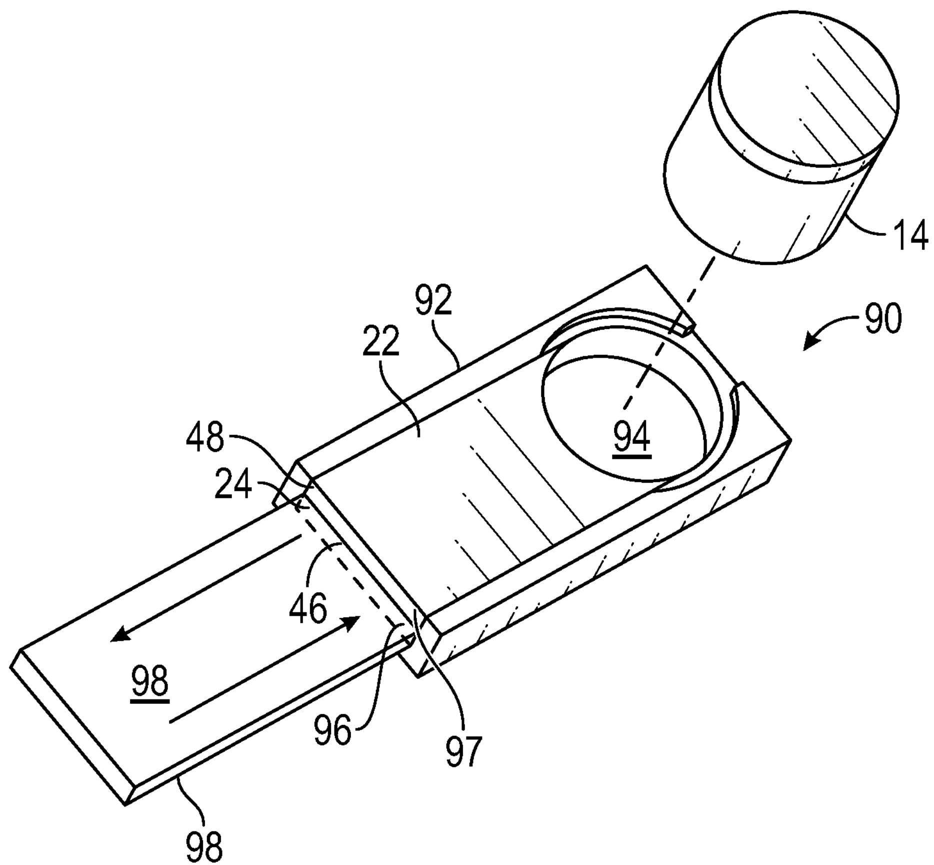
FIG. 6 illustrates the resulting measured sound pressure for each of the passageways.
FIG. 7 is an exploded view of another example of a cooling device with stacked channel sections.

To convert voltage of the RMS values to pressure, the microphone produces 10 mV/Pa of pressure, where the equation 20*log 10 (Pa/20 uPa) provides a sound pressure level (SPL). The resulting measured sound pressure for each of the passageways is shown in FIG. 6, where the left tapered passageway refers to passageway 26 and the left straight passageway refers to passageway of channel section 22' as shown, and the right tapered passageway refers to the right passageway 28 and the left straight passageway refers to passageway of channel section 24'.

For the tapered passageways 26 and 28, there is a measured SPL differential that is approximately 1.67 dB SPL. This measured SPL differential represents the airflow through the passageways 26 and 28 (0.0328 Pa).

Converting a pressure differential to a flow rate is accomplished by first multiplying the SPL differential by 2, and then dividing by the density of the material. Air has a density of approximately 1.225 kg/$m^3$. This yields a result of (2*0.0328*1.225) 0.08036 $m^2/s^2$.

The next step is to take the square root of this number, which gives us 0.2835 m/s, which is the velocity of the air flowing through passageways 26 and 28.

To scale by the size of the passageway, the fluid flow rate is determined by multiplying this velocity times the average area of the passageway (20 $mm^2$), thus a fluid flow rate of 5.67 $cm^3/s$.

Referring to FIG. 7 is an exploded view of another example of a cooling device at 90. The device 90 has an elongated body 92 including a cavity 94 at one end, and a recess 96 extending from the cavity 94. Channel sections 22 and 24 are stacked and positioned in the recess 96 with channel section 22 on top of channel section 24, such that the channel section 22 is parallel to the channel section 24. The channel sections 22 and 24 are adjacent one another and have a common wall 97 separating passageway 26 from passageway 28. The speaker 14 is coupled to a top portion of the central body 92 and has a membrane facing cavity 94 to seal the cavity 94 with the channel sections 22 and 24. Due to the configuration of stacked channel sections 22 and 24, the speaker 14 causes air to be pulled into cavity 94 to produce an airflow in one direction through the passageway 28, such that the air exits through the passageway 26 to produce a net airflow in one direction. As previously described, the passageways 26 and 28 have a cross-sectional area that is "ramped" from large to small, due to a divider 34 positioned in the respective passageway and angled from one end of the channel section to the other end. The larger opening 40 of passageway 26 in channel section 22 opens to cavity 94, and the smaller opening 42 of passageway 28 in channel section 24 opens to cavity 94. The channel sections 22 and 24 are stacked together to produce a total ported solution with disparate exits on each end, thereby having air flow in channel section 24 and out of channel section 22.

An electrical component 98, such as an integrated circuit, is positioned adjacent the openings 46 and 48 and which is cooled by the generated unidirectional air flow of device 90. Ambient air flows across the top surface of the electrical component 98 in a direction parallel to the electrical component, and then enters the larger opening 46 of channel section 24 thereby cooling the electrical component 98. The exiting air flow from opening 48 also helps to cool the electrical component 98.

Figure 8B:
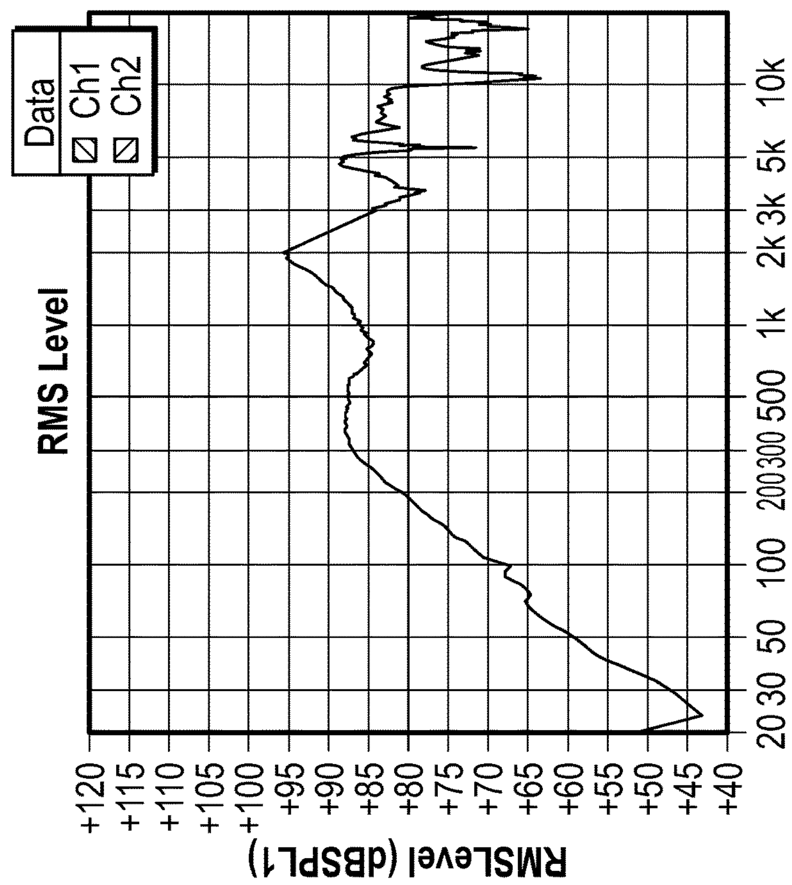
FIG. 8B illustrates the RMS values of the THD.
Figure 8A:
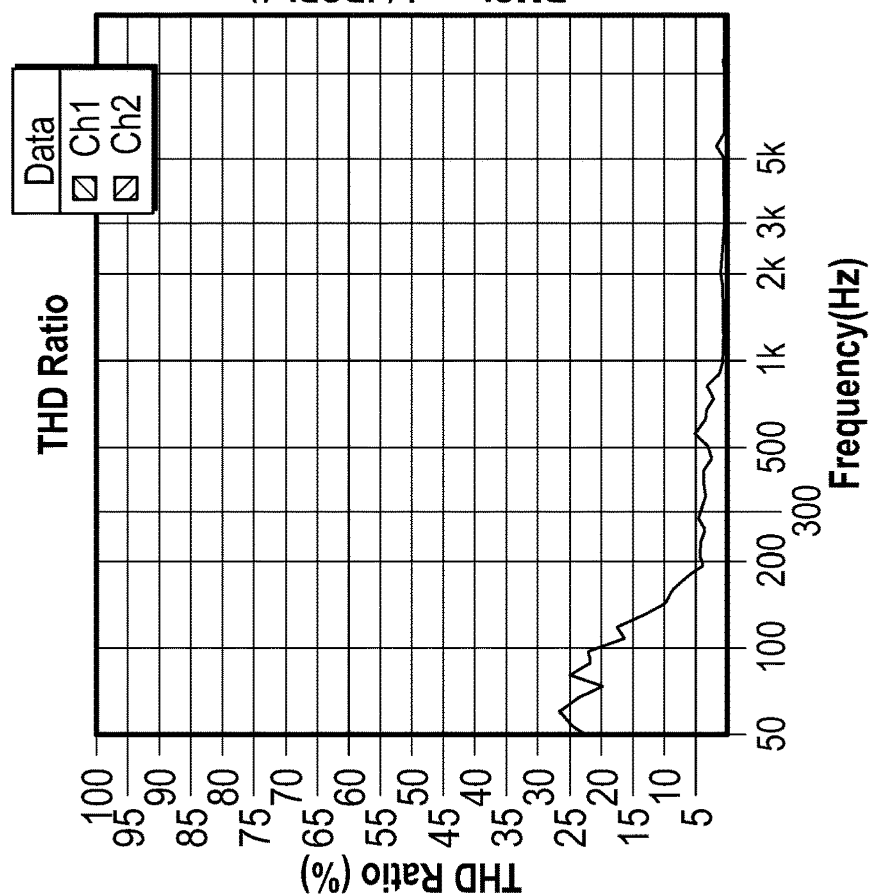
FIG. 8A illustrates the frequency of the THD.

Total harmonic distortion (THD) of the sonic output is measured using the microphone as previously described at the openings 46 and 48 of the stacked channel sections 22 and 24. The frequency of the THD is shown in FIG. 8A, and the RMS values of the THD is shown in FIG. 8B. A divider (not shown) is used to isolate the air flow at each opening 46 and 48 for testing. The THD at each opening 46 and 48 is relatively low until the frequency response of the THD is falling off, indicating operation below the usable bandwidth of the system. This proves the unidirectional flow through the tapered passageways 26 and 28 does not appreciably increase distortion of the system.

Figure 9A:
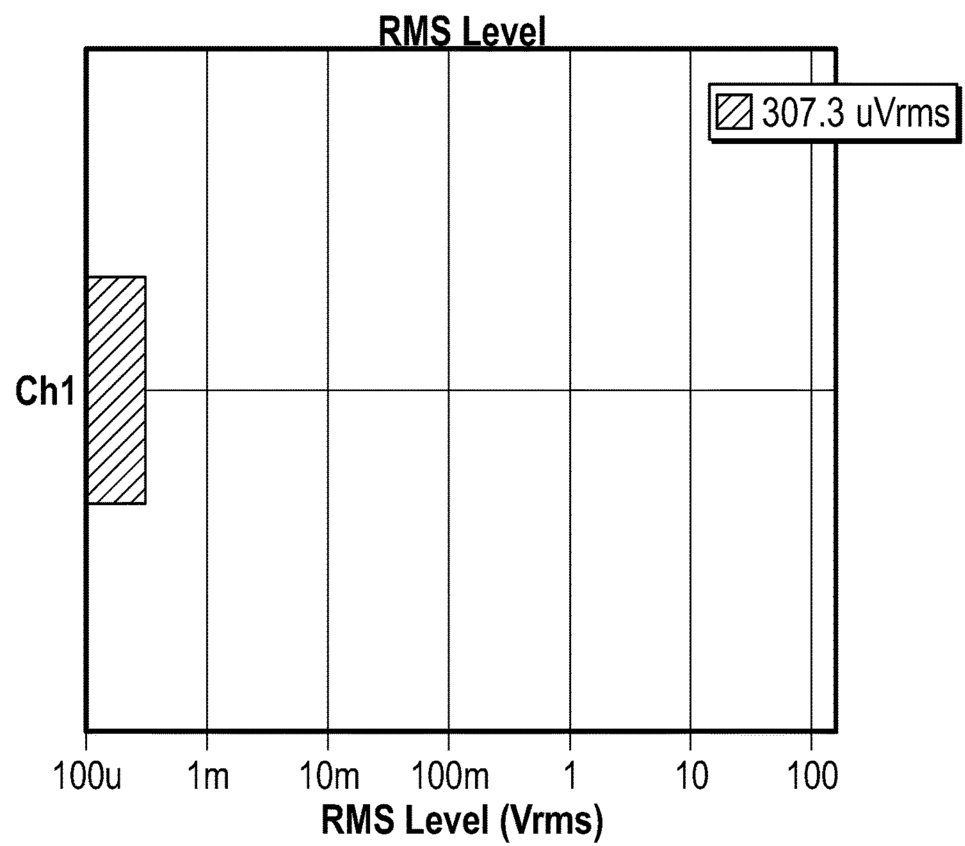
FIG. 9A illustrates the RMS value at the smaller opening of channel section as a function of frequency.
Figure 9B:
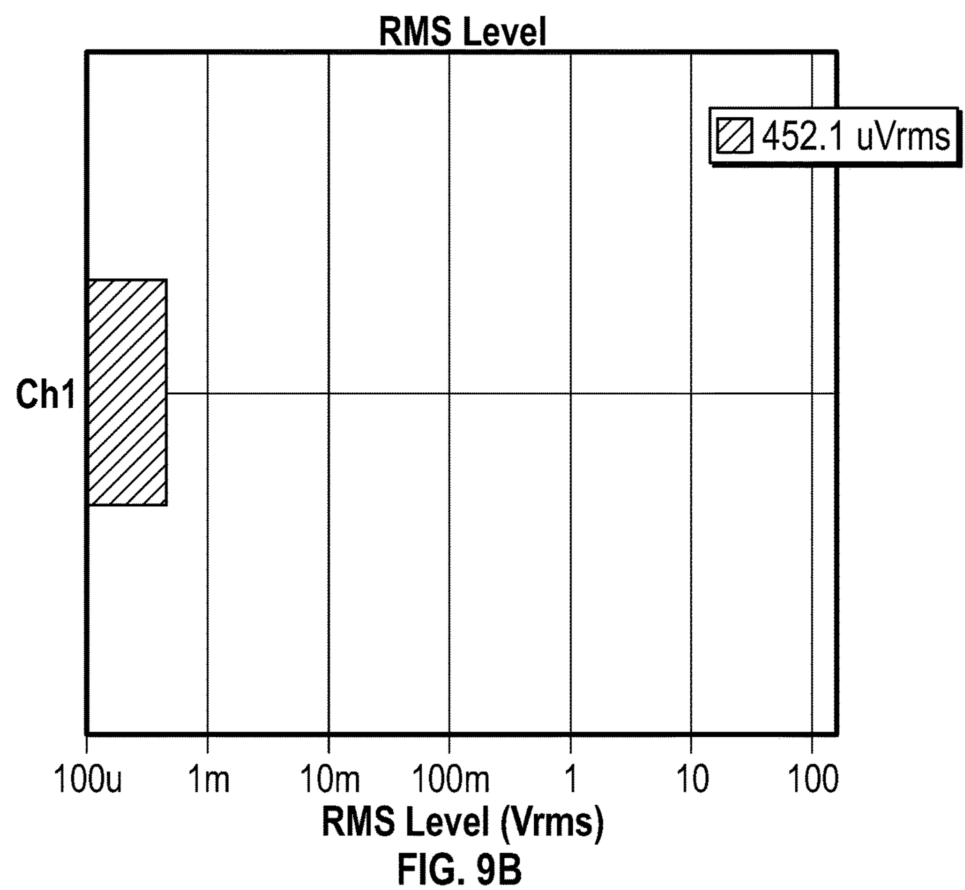
FIG. 9B illustrates the RMS value at the larger opening of the channel section.

The RMS value at the smaller opening 48 of channel section 22 as a function of frequency is shown in FIG. 9A, and the RMS value at the larger opening 46 of the channel section 24 is shown in FIG. 9B.

FIG. 10 illustrates the calculated pressure at each opening 46 and 48. Based on this pressure differential, the flow rate (velocity) of generated air flow is determined to be 18 cm/s based on a cross sectional average area of 9.5 mm×2 mm (0.19 $cm^2$). The flow volume is 3.58 $cm^3/s$.

In an example, for a flow rate of 18 cm/s across an integrated circuit 90 having an integrated circuit size of 14×14 mm, where ambient air is 35 degrees C. and the surface temperature of the integrated circuit is 85 degrees C., the calculated heat transfer coefficient is 13.75 W/m-K (natural convection heat transfer coefficient with the same assumptions (but without air flow) is 9.52 W/m-K). With this temperature difference, integrated circuit area and calculated heat transfer coefficient, the calculated heat dissipated is 119.2 mW. This solution results in a 45% increase in heat transfer coefficient and heat dissipation.

In another example, the electrical component 98 can be positioned in cavity 94 such that ambient air flows in through passageway 28, across the upper surface of the electrical component 98 to provide cooling, and the heated air is expelled through passageway 26.

Figure 11A:
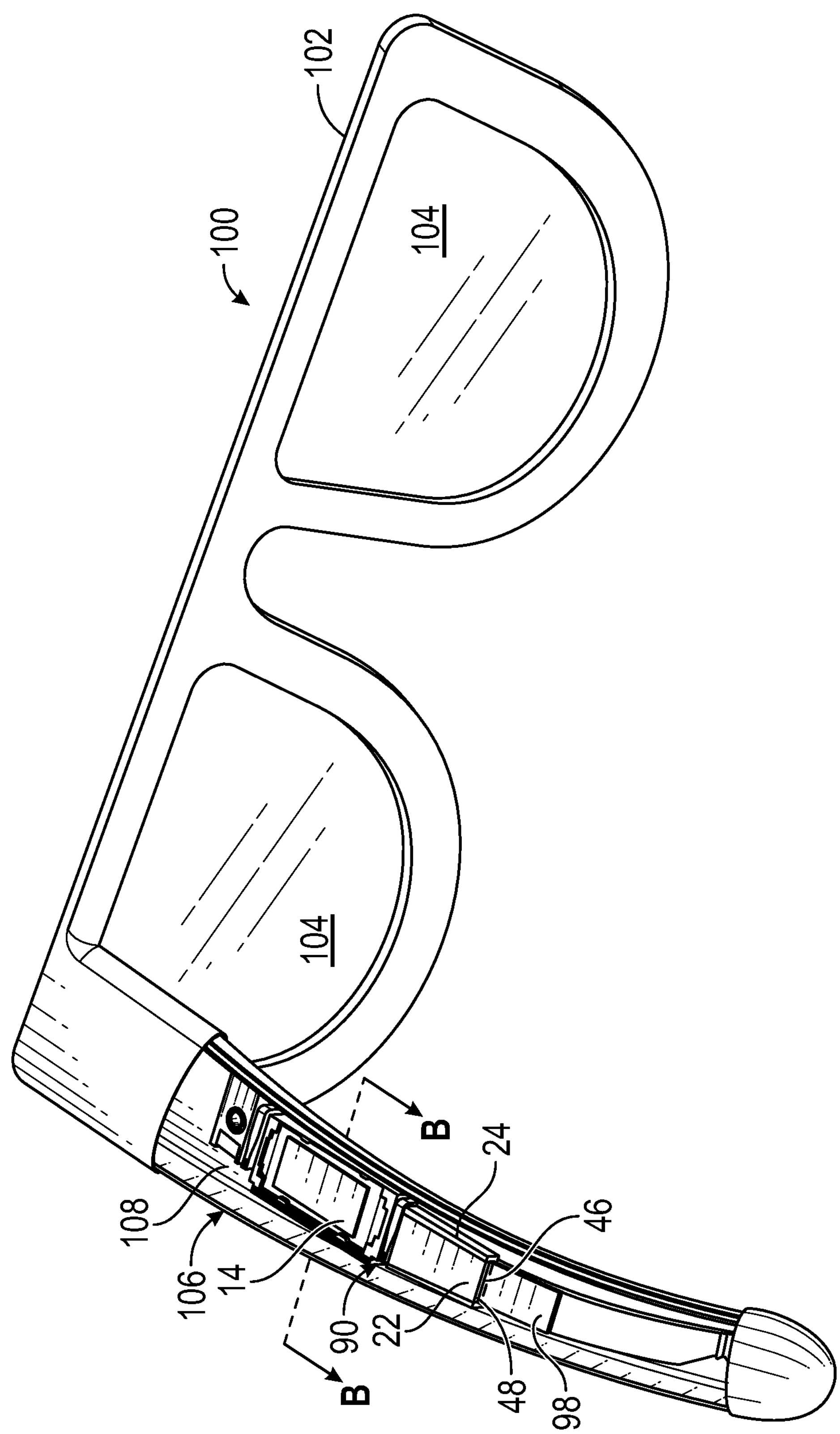
FIG. 11A illustrates a partial sectional view of eyewear.
Figure 11B:
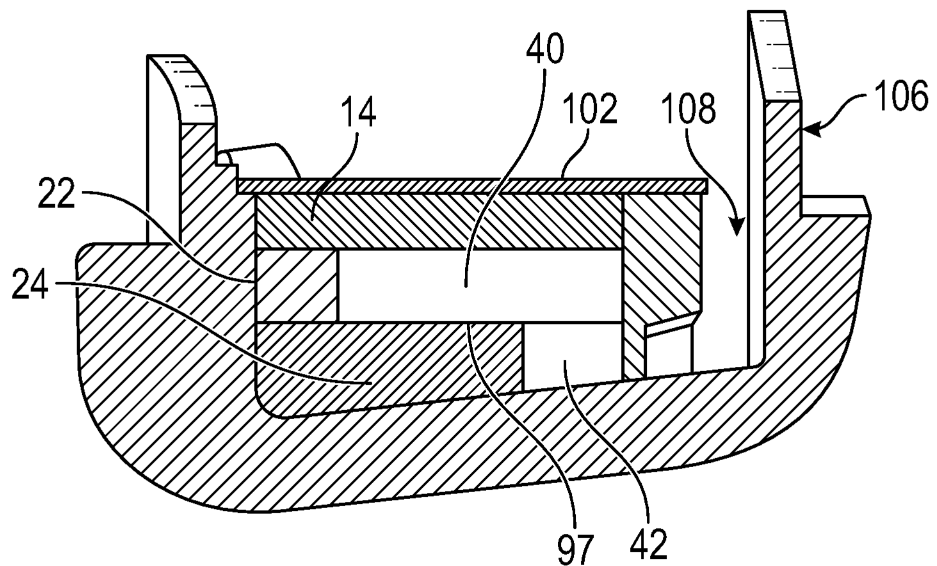
FIG. 11B is a sectional view taken along line B-B in FIG. 11A.

Referring now to FIG. 11A there is illustrated a partial sectional view of eyewear 100 having a frame 102 supporting optical members 104 that may include see-through image displays, and a temple 106 extending from the frame 102 and having an elongated cavity 108 including the cooling device 98 shown in FIG. 7. FIG. 11B is a sectional view taken along line B-B in FIG. 11A. The electrical component 98 may be configured to operate a portion of eyewear 100, such as image displays in the optical members 104, cameras, or a combination thereof. The electrical component 98 produces significant heat during operation, and is positioned in the small and narrow cavity 108 such that the heat is not easily dissipated. The speaker 14 of cooling device 90 produces a net air flow across the top surface of the electrical component 98 to cool the electrical component 98, such as an integrated circuit, without using a mechanical fan. As shown in FIG. 11A, the channel section 22 is positioned over channel section 24, and thus opening 40 of passageway 26 is positioned over opening 42 of passageway 28.

Figure 12:
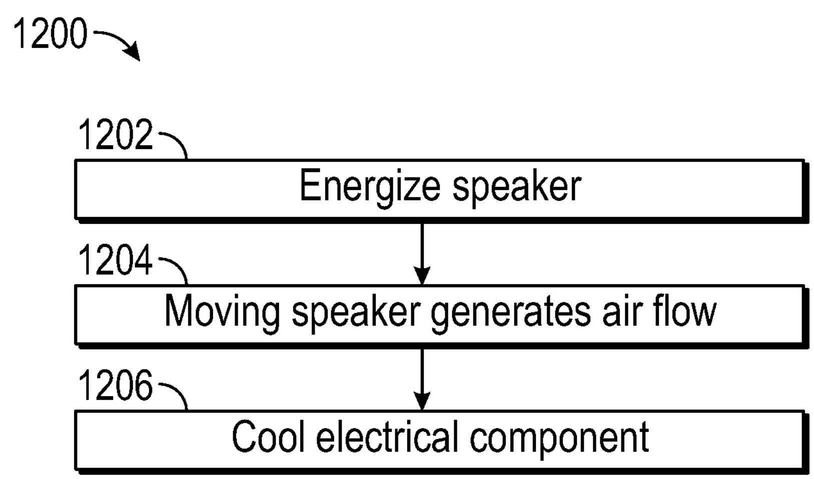
FIG. 12 is a method of using the cooling device to cool an electrical component.

Referring to FIG. 12, there is shown a method 1200 operating the cooling devices 10 and 90.

At step 1202, the speaker 14 is energized with an electrical signal to drive the speaker 14. The electrical signal may have a frequency of 60 Hz as previously described to keep the sonic energy below the frequency range of a human ear. Other low frequencies may be used, and limitation to this frequency is not to be inferred. The electrical signal causes the speaker membrane of the speaker 14 to move up and down.

At step 1204, the moving speaker 14 is configured to move air in and out of cavity 32 and 94, respectively. Since the opening 40 of passageway 26 is larger than the opening 42 of passageway 28, the speaker 14 generates a net air flow into passageway 28 via opening 46 and out of passageway 26 via opening 48.

At step 1206, the net air flow flows unidirectionally over the upper surface of the electrical component 98 to cool the electrical component 98. In the example of FIG. 1, the electrical component 98 may be positioned in front of opening 46 of the channel section 24. In the example of FIG. 7, the electrical component 98 is placed in front of the openings 46 and 48 of the channel sections 22 and 24. The cooling devices 10 and 90 may be positioned in the temple 108 of eyewear 100, as shown in FIG. 11, to cool the electrical component 98 in the temple without using a fan.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," "includes," "including," or any other variation thereof, are intended to cover a non-exclusive inclusion, such that a process, method, article, or apparatus that comprises or includes a list of elements or steps does not include only those elements or steps but may include other elements or steps not expressly listed or inherent to such process, method, article, or apparatus. An element preceded by "a" or "an" does not, without further constraints, preclude the existence of additional identical elements in the process, method, article, or apparatus that comprises the element.

Unless otherwise stated, any and all measurements, values, ratings, positions, magnitudes, sizes, and other specifications that are set forth in this specification, including in the claims that follow, are approximate, not exact. Such amounts are intended to have a reasonable range that is consistent with the functions to which they relate and with what is customary in the art to which they pertain. For example, unless expressly stated otherwise, a parameter value or the like may vary by as much as ±10% from the stated amount.

In addition, in the foregoing Detailed Description, it can be seen that various features are grouped together in various examples for the purpose of streamlining the disclosure. This method of disclosure is not to be interpreted as reflecting an intention that the claimed examples require more features than are expressly recited in each claim. Rather, as the following claims reflect, the subject matter to be protected lies in less than all features of any single disclosed example. Thus, the following claims are hereby incorporated into the Detailed Description, with each claim standing on its own as a separately claimed subject matter.

While the foregoing has described what are considered to be the best mode and other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present concepts.

What is claimed is:

1. A cooling device, comprising:

a body member having a cavity;

a first channel section having a first passageway extending from the cavity, wherein the first passageway is tapered from a first input opening directly coupled to the cavity to a first output opening, wherein the first input opening is larger than the first output opening;

a second channel section having a second passageway extending from the cavity, wherein the second passageway is tapered from a second input opening directly coupled to the cavity to a second output opening, wherein the second input opening is smaller than the second output opening; and a speaker coupled to the cavity, wherein the speaker is configured to generate an air flow into the second channel section and out the first channel section.

2. The cooling device as specified in claim 1, further comprising an electrical component adjacent either the first output opening or the second output opening such that the air flow is configured to traverse across and cool the electrical component.

3. The cooling device as specified in claim 2, wherein the first output opening and the second output opening are coupled to the electrical component.

4. The cooling device as specified in claim 1, wherein the first channel section and the second channel section are separated away from each other.

5. The cooling device as specified in claim 1, wherein the first channel section and the second channel section are stacked.

6. The cooling device as specified in claim 5, wherein the first output opening and the second output opening are closely proximate one another.

7. The cooling device as specified in claim 5, wherein the first channel section and the second channel section share a common wall.

8. The cooling device as specified in claim 5, wherein the first channel section and the second channel section are parallel to each other.

9. The cooling device as specified in claim 1, further comprising eyewear having a frame supporting an optical member and having a temple, wherein the body member, the speaker, and the first and second channel sections are positioned in the temple.

10. The cooling device as specified in claim 1, further comprising a divider extending in the first channel section to create the tapered first passageway.

11. A method of cooling a device having a body member having a cavity, a first channel section having a first passageway extending from the cavity, wherein the first passageway is tapered from a first input opening directly coupled to the cavity to a first output opening, wherein the first input opening is larger than the first output opening, a second channel section having a second passageway extending from the cavity, wherein the second passageway is tapered from a second input opening directly coupled to the cavity to a second output opening, wherein the second input opening is smaller than the second output opening, a speaker coupled to the cavity, comprising:

energizing the speaker to generate an air flow into the second channel section and out the first channel section; and cooling an electrical component using the generated air flow.

12. The method as specified in claim 11, wherein the electrical component is adjacent either the first output opening or the second output opening such that the air flow is configured to traverse across the electrical component.

13. The method as specified in claim 11, wherein the first channel section and the second channel section are separated away from each other.

14. The method as specified in claim 11, wherein the first channel section and the second channel section are stacked.

15. The method as specified in claim 14, wherein the first output opening and the second output opening are closely proximate one another.

16. The method as specified in claim 14, wherein the first output opening and the second output opening are coupled to the electrical component.

17. The method as specified in claim 14, wherein the first channel section and the second channel section share a common wall.

18. The method as specified in claim 14, wherein the first channel section and the second channel section are parallel to each other.

19. The method as specified in claim 11, further comprising eyewear having a frame supporting an optical member and having a temple, wherein the body member, the speaker, the first and second channel sections and the electrical component are positioned in the temple.

20. The method as specified in claim 11, further comprising a divider extending in the first channel section to create the tapered first passageway.

* * * * *